US011181946B2

United States Patent
Zhang

(10) Patent No.: US 11,181,946 B2
(45) Date of Patent: Nov. 23, 2021

(54) DISPLAY PANEL AND DISPLAY DEVICE

(71) Applicant: Wuhan China Star Optoelectronics Semiconductor Display Technology Co., LTD., Hubei (CN)

(72) Inventor: Jingjing Zhang, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 51 days.

(21) Appl. No.: 16/895,720

(22) Filed: Jun. 8, 2020

(65) Prior Publication Data

US 2021/0200271 A1    Jul. 1, 2021

(51) Int. Cl.
*G06F 1/16* (2006.01)
*G09F 9/30* (2006.01)

(52) U.S. Cl.
CPC ............ *G06F 1/1652* (2013.01); *G09F 9/301* (2013.01)

(58) Field of Classification Search
CPC combination set(s) only.
See application file for complete search history.

(56) References Cited

U.S. PATENT DOCUMENTS

| 10,606,388 B2* | 3/2020 | Shi | G06F 3/04164 |
|---|---|---|---|
| 2006/0007059 A1* | 1/2006 | Bell | G06F 1/163 345/55 |
| 2017/0261650 A1* | 9/2017 | Powell | G02B 3/0062 |
| 2017/0261729 A1* | 9/2017 | Powell | G02B 3/0062 |
| 2018/0212051 A1* | 7/2018 | Wu | G02F 1/133305 |
| 2020/0321356 A1* | 10/2020 | Shang | G02F 1/1368 |
| 2020/0335567 A1* | 10/2020 | Tu | H01L 27/3276 |
| 2021/0037646 A1* | 2/2021 | Xiao | H05K 1/189 |

* cited by examiner

*Primary Examiner* — Lisa Lea-Edmonds
(74) *Attorney, Agent, or Firm* — Benesch, Friedlander, Coplan & Aronoff LLP

(57) ABSTRACT

The invention provides a display panel and a display device. The display panel includes a bending area which includes at least one trace, with openings formed on an edge of one side of the trace. A first hole array and a second hole array are located on the trace. The second hole array is located at a configuring side of the first hole array. The configuring side is a side adjacent to the openings. The first hole array includes a plurality of primary holes. The second hole array includes a plurality of secondary holes. The positions of the primary holes correspond to the positions of openings, and the positions of secondary holes corresponds to a connecting position where two adjacent first openings connect. The display panel and display device of the invention can avoid trace breaking and improve product yield.

18 Claims, 5 Drawing Sheets

DISPLAY PANEL AND DISPLAY DEVICE

CROSS REFERENCE TO RELATED APPLICATIONS

This application claims the priority to Chinese Patent Application No. 201911407947.3, titled "DISPLAY PANEL AND DISPLAY DEVICE", filed with National Intellectual Property Administration on Dec. 31, 2019, which is incorporated by reference in the present application in its entirety.

BACKGROUND OF INVENTION

Field of Invention

The invention relates to the technical field of display, in particular to a display panel and a display device.

Description of Prior Art

As display panels continue to evolve, minimizing display border panels have become a research hotspot. A display panel typically includes a display area and a bending area. The bending area typically has a plurality of metal traces which are used to connect the signal traces of the display area and an external driver chip.

To realize a structure for a full screen with an arrow bezel, a pad bending area should be bendable. The metal traces distributed in the pad bending area, however, are subject to stress strain and may even break under bending stress, which may cause the bending area to fail and reduce product yield. Therefore, it is desirable to provide a display panel and a display device to solve the current technical problems.

SUMMARY OF INVENTION

An objective of the invention is to provide a display panel and display device, which can avoid trace breaking and improve product yield.

To solve the described technical problems, the invention provides a display panel characterized by comprising:

a bending area which comprises:

at least one trace, wherein an edge of at least one side of the trace has a plurality of openings, a first hole array and a second hole array are located on the trace, the second hole array is located at a configuring side of the first hole array, the configuring side is adjacent to the plurality of openings, the first hole array comprises a plurality of primary holes, the second hole array comprises a plurality of secondary holes, the positions of the primary holes correspond to the positions of the plurality of openings, and the positions of the plurality of secondary holes corresponds to a connecting position where two adjacent first openings connect. The invention further provides a display device, which comprises the above-mentioned display panel.

The display panel and the display device of the invention include openings formed at edges of both sides of the trace, the first hole array formed on the trace, and the second hole array formed on both sides of the first hole array, to realize an area (region A) of multiple arc-like structures. Thus, the strength and concentration of stress are effectively reduced, the bendability of the trace is improved, trace breaking may be avoided, and product yield may be improved.

DETAILED DESCRIPTION OF PREFERRED EMBODIMENTS

Figure 1:
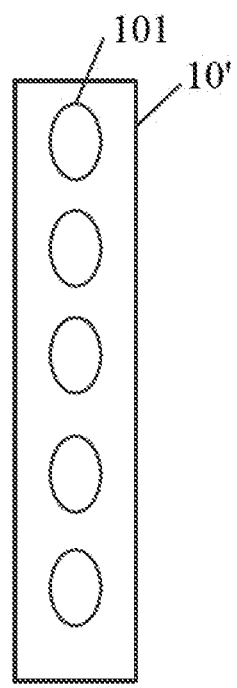
FIG. 1 is a top view of a trace in a current bending area.

The description of embodiments in the following is to illustrate specific embodiments of the present invention with reference to the accompany drawings. The directional terms mentioned in the present invention, such as "upper", "lower", "before", "after", "left", "right", "inside", "outside", and "side" just refer to directions in the drawings. Therefore, the directional terminology is used for the purpose of illustration and understanding of the invention, and not used for limiting the invention.

As shown in FIG. 1, a plurality of holes 101 are formed on a trace 10' in a current bending area, which is used to release stress during bending and prevent the trace from breaking.

With reference to FIGS. 2-6, FIG. 2 is a first top view of a trace in a bending area according to the invention.

Figure 2:
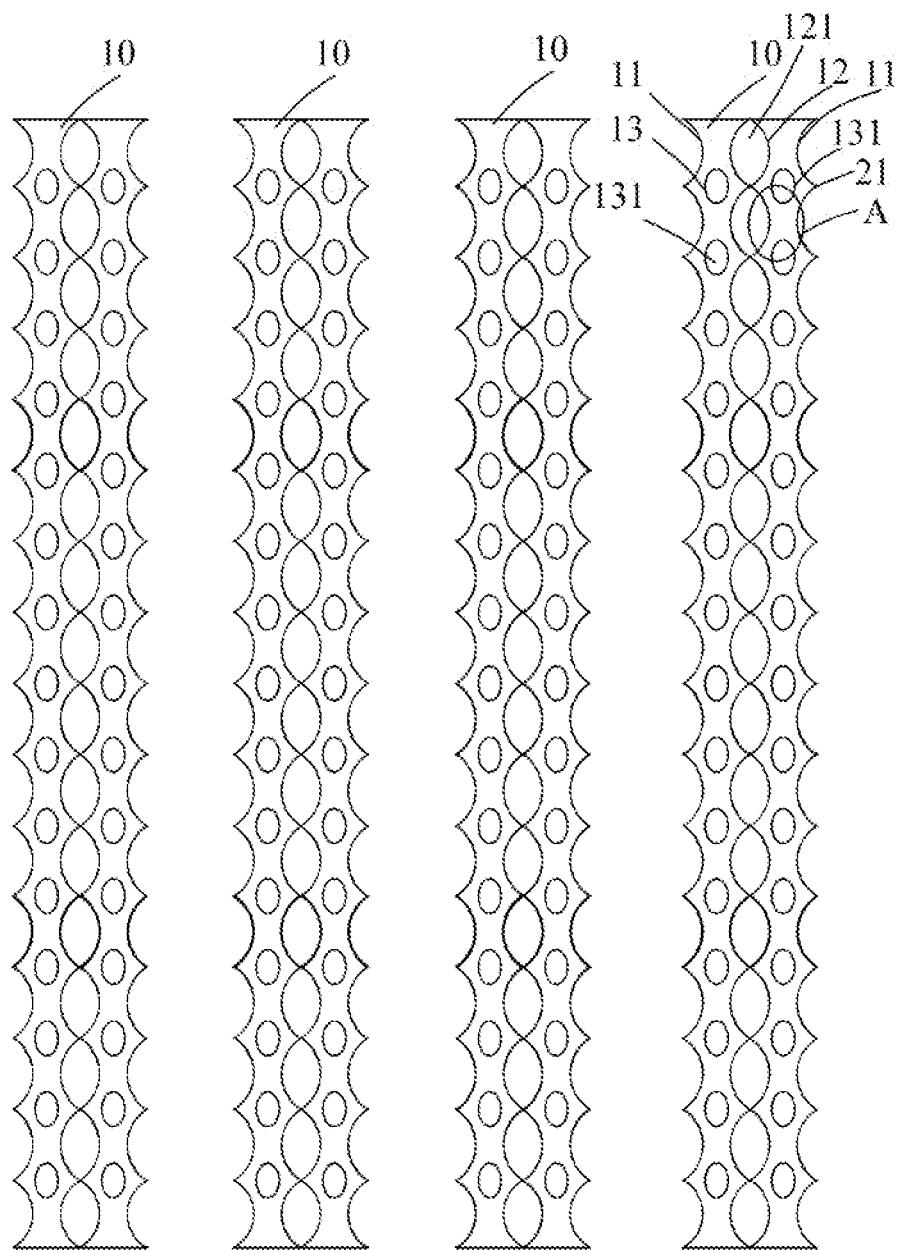
FIG. 2 is a first top view of a trace in a bending area according to the invention.
Figure 3:
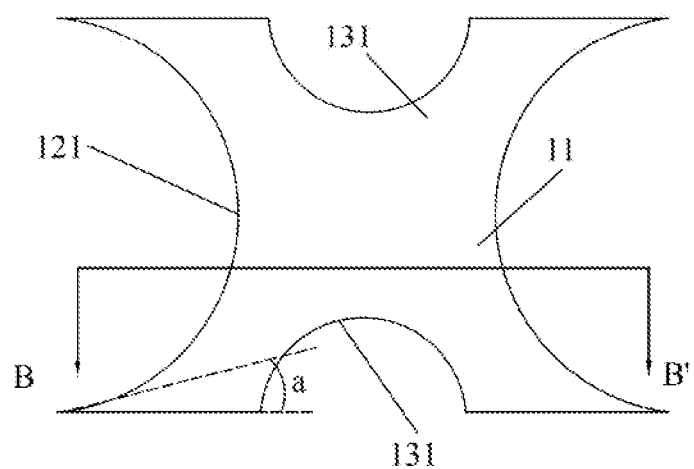
FIG. 3 is a zoom-in view of an area A in FIG. 2.
Figure 4:
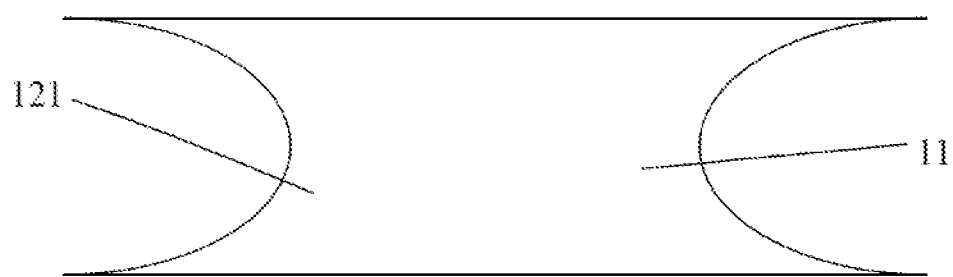
FIG. 4 is a front view corresponding to FIG. 3.

For example, as shown in FIGS. 2-4, a display panel in the embodiment includes a bending area, which includes a plurality of traces 10. Openings 11 are formed at edges of both sides of the trace 10. That is both right and left sides of the trace 10 have openings 11.

In one embodiment, to further reduce the stress on the trace, the openings 11 at one side of the trace 10 are located to correspond to the openings 11 on the other side of the trace 10. That is, the positions of the openings 11 on both sides of trace 10 are correlated.

A first hole array 12 is formed on the trace 10, and a second hole array 13 is formed on both sides of the first hole array 12.

The first hole array 12 comprises a plurality of primary holes 121. The positions of the primary holes 121 corresponds to the positions of the openings 11. The second hole array 13 comprises a plurality of secondary holes 131. The positions of the secondary holes 131 corresponds to a connecting position 21 where two adjacent first openings 11 connect.

In one embodiment, shapes of the primary hole 121 and the secondary hole 131 may be ellipses or circles, and shapes of the openings 11 may be arcs. When the shapes of the openings are curves, the cutting angle of tips can be reduced, thus further reducing the strength and concentration of stress. Traces with different structures have different stress peaks and stress concentration. As shown in FIG. 3, traces with cutting angles a of tips (the angle between a tangent line of the opening and the a line extended from a front side wall) being 90 degrees, 60 degrees, 30 degrees, and 0 degrees respectively (that is, arc shaped) have descending stress peaks which decreases with the descending cutting angles (the decreasing extent may be one order of magnitude). The stress concentration also decreases similarly with the descending cutting angles.

In order to reduce the stress more evenly, so that the trace force is more uniform, the shape of the openings 11 is matched with a shape of the configuring side of the primary hole 121, wherein the configuring side is the side away from of the openings 11. For example, the shape of openings 11 on the left is the same or consistent with the shape of the right side of the primary hole 121. It can be appreciated, of course, that the shapes of the opening, the primary hole, and the secondary hole are not limited to these.

In one embodiment, two adjacent primary holes 121 may be separated, and the spacing between two adjacent primary holes 121 is less than or equal to a first preset spacing. The first preset spacing, for example, may be a radius of the secondary hole 131 or the length of a major axis of the secondary hole 131. In alternative embodiments, the two adjacent primary holes 121 can also be connected to each other. In one embodiment, a primary hole 121 and an adjacent secondary hole 131 are separated.

In one embodiment, a secondary hole 13 is located by each side of every two adjacent primary holes 12. That is, every two primary holes 121 are associated with two secondary holes 131. In one embodiment, the position of a secondary hole 131 located by a first side of a primary hole 121 corresponds to the position of a secondary hole 131 located by a second side of the primary hole 121. Where a plurality of secondary holes 131 by one side of the first hole array 12 and a plurality of secondary holes 131 by the other side of the first hole array 12 are symmetrical relative to a preset line. In one embodiment, the preset line may be a vertical line. That is, the plurality of secondary holes 131 located on the left side of the first hole array 12 are symmetrical with a plurality of secondary holes 131 located on the right side of the first hole array 12 relative to the vertical line. In an alternative embodiment, the positions of secondary holes 131 on the first side of the primary holes 121 are interleaved with the positions of the secondary holes 131 located on the second side of the primary holes 121.

In one embodiment, two adjacent secondary holes 131 on the same side of a first hole array 12 are separated, the spacing between the two adjacent secondary holes 131 by the same side of the first hole array 12 is less than equal to a second preset spacing. The second preset spacing, for example, is the radius of the primary hole 121 or the length of the major axis of the primary hole 121. That is, two adjacent secondary holes 131 located on the left or right side of the first hole array 12 are separated. Of course, two adjacent secondary hole 131 located on the left and right side of the first hole array 12 are spaced apart.

In one embodiment, an area of the secondary hole 131 is less than an area of the primary hole 121. For example, when the shape of the primary hole 121 and the shape of the secondary hole 131 are circulars, the radius of the secondary hole 131 is less than the radius of the primary hole 121. For example, when the shape of the primary hole 121 and the shape of the secondary hole 131 are ellipses, the length of the major axis of the secondary hole 131 is less than the length of the major axis of the primary hole 121, and/or the length of the minor axis of the secondary hole 131 is less than the length of the minor axis of the primary hole 121.

Figure 5:
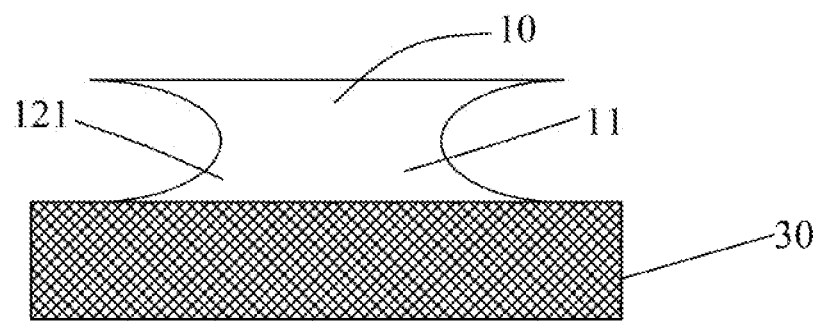
FIG. 5 is a cross sectional view of FIG. 3 along a BB' direction.

In some embodiments, as shown in FIG. 5, an organic layer 20 is located under each trace 10. That is, the trace 10 is located in a metal layer, and the organic layer 20 is located under the metal layer. Using double-layered film layer for the trace can further effectively reduce the degree of stress and stress concentration, thus increasing the bending capacity of the trace.

Figure 6:
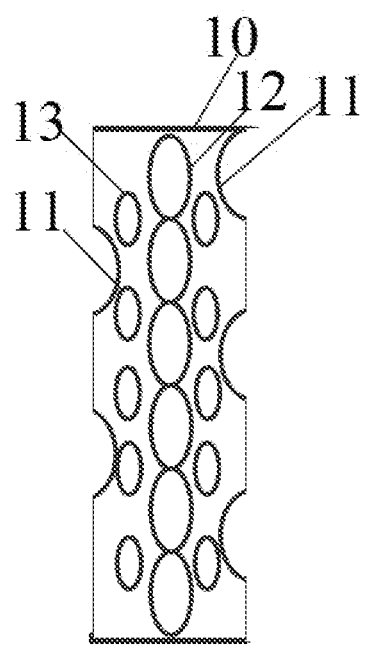
FIG. 6 is a second top view of the trace in the bending area according to the invention.

In other embodiments, as shown in FIG. 6, the openings 11 on one side of the trace 10 and the openings 11 on the other side of the trace 10 may be asymmetrically located.

That is, the openings 11 on one side of the trace 10 is interleaved with the openings 11 on the other side. Specifically, for example, one left opening 11 is located between two adjacent openings on the right, and the openings 11 on the right side may be similarly located.

Of course, it may be appreciated that, in an alternative embodiment, openings 11 may be located at the edge of only one side of the trace 10, and a second hole array 13 is located on the configuring side of the first hole array 12, with the configuring side adjacent to the openings 11. For example, openings 11 are located on the right side of trace 10, the second hole array 13 is located on the right side of the first hole array 12, and the left side of trace 10 is not the configuring side.

It may be appreciated that, the bending area can also include one, two, or more traces 10.

Since openings are located at the edges of both sides of the trace, and the first hole array is located on the trace, and the second hole array is located on both sides of the first hole array, areas (areas A) where multiple edges (sides) being arc-like structured can be formed. Preferably, the area where four sides are arc-like structures may be formed to effectively reduce the degree of stress and stress concentration. Bending capacity of the trace may be enhance thereby, and thus to avoid trace break. Additionally, the second hole array is located on both sides of the first hole array to form the trace structures on both sides which are complementary structures. When one side breaks, the risk of breaking the entire trace may be avoided to improve product yield.

The invention also provides a display device, which comprises any of the described display panels.

In the display panel and display device of the invention, openings are arranged at the edges of both sides of the trace, and the first hole array is located on the trace, and the second hole array is located on both sides of the first hole array. Areas (areas A) where multiple edges being arc-like structured can be formed to effectively reduce the degree of stress and stress concentration. Bending capacity of the trace may be enhance thereby, trace break may be avoided, and product yield may be improved.

In summary, the present invention has been described with preferred embodiments thereof and it is understood that many changes and modifications to the described embodiment can be carried out by a person with ordinary skills in the art without departing from the scope and the spirit of the invention that is intended to be limited only by the appended claims.

What is claimed is:

1. A display panel comprising a bending area, comprising:
   at least one trace, wherein an edge of at least one side of the trace has a plurality of openings;
   a first hole array and a second hole array formed on the trace, wherein the second hole array is located at a configuring side of the first hole array, the configuring side is adjacent to the plurality of openings; the first hole array comprises a plurality of primary holes, the second hole array comprises a plurality of secondary holes, positions of the primary holes correspond to positions of the plurality of openings, and the positions of the plurality of secondary holes corresponds to a connecting position where two adjacent first openings connect.

2. The display panel of claim 1, wherein the plurality of openings on one side of the trace are located to correspond to the plurality of openings on the other side of the trace.

3. The display panel of claim 1, wherein a secondary hole is located on each side of every two adjacent primary holes.

4. The display panel of claim 1, wherein a plurality of secondary holes located on one side of the first hole array the is symmetrical with a plurality of secondary holes on the other side of the first hole array relative to a preset line.

5. The display panel of claim 1, wherein two adjacent primary holes are spaced apart by an spacing, and the spacing between the two adjacent primary holes is less than or equal to a first preset spacing.

6. The display panel of claim 1, wherein two adjacent secondary holes on the same side of the first hole array are spaced apart by an spacing, and the spacing between the two adjacent secondary holes on the same side of the first hole array is less than or equal to a second preset interval.

7. The display panel of claim 1, wherein a shape of the plurality of openings matches a shape of the configuring side of the plurality of primary holes, wherein the configuring side is a side away from the plurality of openings.

8. The display panel of claim 1, wherein shapes of the plurality of primary holes and the plurality of secondary holes are ellipses or circles, and shapes of the plurality of openings are arcs.

9. The display panel of claim 1, wherein an organic layer is further arranged below each trace.

10. A display device comprising a bending area, wherein the bending area comprises:
    at least one trace, wherein an edge of at least one side of the trace has a plurality of openings;
    a first hole array and a second hole array formed on the trace, wherein the second hole array is located at a configuring side of the first hole array, the configuring side is adjacent to the plurality of openings; the first hole array comprises a plurality of primary holes, the second hole array comprises a plurality of secondary holes, positions of the primary holes correspond to positions of the plurality of openings, and the positions of the plurality of secondary holes corresponds to a connecting position where two adjacent first openings connect.

11. The display device of claim 10, wherein the plurality of openings on one side of the trace are located to correspond to the plurality of openings on the other side of the trace.

12. The display device of claim 10, wherein a secondary hole is located on each side of every two adjacent primary holes.

13. The display device of claim 10, wherein a plurality of secondary holes located on one side of the first hole array the is symmetrical with a plurality of secondary holes on the other side of the first hole array relative to a preset line.

14. The display device of claim 10, wherein two adjacent primary holes are spaced apart by an spacing, and the spacing between the two adjacent primary holes is less than or equal to a first preset spacing.

15. The display device of claim 10, wherein two adjacent secondary holes on the same side of the first hole array are spaced apart by an spacing, and the spacing between the two adjacent secondary holes on the same side of the first hole array is less than or equal to a second preset interval.

16. The display device of claim 10, wherein a shape of the plurality of openings matches a shape of the configuring side of the plurality of primary holes, wherein the configuring side is a side away from the plurality of openings.

17. The display device of claim 10, wherein shapes of the plurality of primary holes and the plurality of secondary holes are ellipses or circles, and shapes of the plurality of openings are arcs.

18. The display device of claim 10, wherein an organic layer is further arranged below each trace.

\* \* \* \* \*